United States Patent
Booth, Jr. et al.

(10) Patent No.: US 7,353,130 B2
(45) Date of Patent: Apr. 1, 2008

(54) METHOD AND APPARATUS FOR IMPLEMENTING AUTOMATIC-CALIBRATION OF TDR PROBING SYSTEM

(75) Inventors: Roger Allen Booth, Jr., Rochester, MN (US); Matthew Stephen Doyle, Rochester, MN (US); Lynn Robert Landin, Rochester, MN (US); Thomas W. Liang, Rochester, MN (US); Ankur Kanu Patel, Byron, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/781,372

(22) Filed: Jul. 23, 2007

(65) Prior Publication Data

US 2007/0265793 A1 Nov. 15, 2007

Related U.S. Application Data

(62) Division of application No. 11/304,141, filed on Dec. 15, 2005, now Pat. No. 7,299,144.

(51) Int. Cl.
*G01R 35/00* (2006.01)
(52) U.S. Cl. ...................................... 702/107
(58) Field of Classification Search ............... 702/57, 702/65, 66, 70, 71, 80, 91, 93, 104, 107, 702/116, 168, 183; 356/319; 324/72.5, 324/532, 601
See application file for complete search history.

(56) References Cited

U.S. PATENT DOCUMENTS

| 4,608,657 | A  | * | 8/1986  | Manome et al. ............... 702/89 |
|-----------|----|---|---------|-------------------------------------|
| 4,758,779 | A  |   | 7/1988  | Throng                              |
| 4,827,437 | A  |   | 5/1989  | Blanton                             |
| 6,469,514 | B2 |   | 10/2002 | Okayasu                             |
| 6,667,803 | B1 |   | 12/2003 | Flessland et al.                    |
| 2003/0112017 | A1 | | 6/2003  | McPherson et al.                    |
| 2004/0186675 | A1 | | 9/2004  | Larson et al.                       |
| 2006/0104824 | A1 | | 5/2006  | Schnall                             |

\* cited by examiner

*Primary Examiner*—Edward Raymond
*Assistant Examiner*—Mohamed Charioui
(74) *Attorney, Agent, or Firm*—Joan Pennington

(57) ABSTRACT

A method and apparatus are provided for implementing automatic-calibration of a Time Domain Reflectometer (TDR) probing apparatus. A calibration procedure is performed automatically each time a TDR probe is moved from a device under test (DUT). A current calibration TDR waveform is obtained and compared with a reference calibration TDR waveform, checking for deviations between the current and reference measurements. If a deviation is detected, then the user is notified and calibration is failed.

4 Claims, 5 Drawing Sheets

METHOD AND APPARATUS FOR IMPLEMENTING AUTOMATIC-CALIBRATION OF TDR PROBING SYSTEM

This application is a divisional application of Ser. No. 11/304,141 filed on Dec. 15, 2005 now U.S. Pat. No. 7,299,144.

FIELD OF THE INVENTION

The present invention relates generally to the data processing field, and more particularly, relates to a method and apparatus for automatically implementing calibration of a Time Domain Reflectometer (TDR) probing apparatus used for testing a printed circuit board.

DESCRIPTION OF THE RELATED ART

As used in the present specification and claims, the term printed circuit board or PCB means a substrate or multiple layers (multi-layer) of substrates used to electrically attach electrical components and should be understood to generally include circuit cards, printed circuit cards, printed wiring cards, and printed wiring boards.

Characteristic impedance is most commonly measured using time-domain techniques, typically time-domain reflectometry (TDR). Currently problems result from some manufacturers using uncalibrated TDR test equipment for screening raw card impedance. TDR test equipment that fails calibration tests may be identified weeks or months after an initial calibration failure. Either calibration procedures are not performed or are not performed often enough to appropriately screen parts. This failure can result in significant expense to a manufacturer and its customers.

Significant problems are introduced by lack of adequate equipment calibration when performing impedance measurements and posting the resulting data. For example, rigid card and flexible printed circuit vendors are required to deliver product that meets predefined characteristic impedance within a given tolerance. However, the data is only valid when proper calibration schedules are maintained for the TDR test equipment.

A need exists for an effective mechanism for improving the reliability of impedance data captured for printed circuit boards.

SUMMARY OF THE INVENTION

Principal aspect of the present invention is to provide a method and apparatus for automatically implementing calibration of a Time Domain Reflectometer (TDR) probing apparatus. Other important aspects of the present invention are to provide such method and apparatus for automatically implementing calibration of a Time Domain Reflectometer (TDR) probing apparatus substantially without negative effect and that overcome many of the disadvantages of prior art arrangements.

In brief, a method and apparatus are provided for implementing automatic-calibration of a Time Domain Reflectometer (TDR) probing apparatus. A calibration procedure is performed automatically each time a TDR probe is moved from a device under test (DUT). A current calibration TDR waveform is obtained and compared with a reference calibration TDR waveform, checking for deviations between the current and reference measurements. If a deviation is detected, then the user is notified and calibration is failed.

In accordance with features of the invention, both the current calibration TDR waveform and the reference calibration TDR waveform are obtained using a known impedance standard contained within the TDR probe.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, an enhanced TDR probe is provided and used to implement an automatic-calibration method of the invention. The enhanced TDR probe is used with a computer test system for implementing automatic-calibration of a Time Domain Reflectometer (TDR) probing apparatus. The enhanced TDR probe can be sold to a customer as an upgrade and marketed as a productivity and yield/data quality enhancement tool.

In accordance with features of the invention, the method of the invention automatically checks the calibration of the probe and test equipment each time the user completes a normal measurement. This guarantees that the test setup is always calibrated and resulting measurement data is not subject to calibration error. The automatically-calibrated TDR probing apparatus is used to screen PCBs and printed flexible circuits for required characteristic impedance prior to shipping product, and advantageously can ensure that only product within an acceptable characteristic impedance Zo specification is shipped. Shipment errors due to calibration error are reduced since the operator is flagged the instant the probe is detected to be out of calibration, rather than the next morning or next week or whenever the calibration procedure is performed again. Even when normal procedures may require daily calibration, these procedures are sometimes not performed. Moreover, if a test setup drifts out of calibration within the specified timeframe, such as daily and the like, hundreds of individual product could be shipped out of specification within this timeframe.

Figure 1:
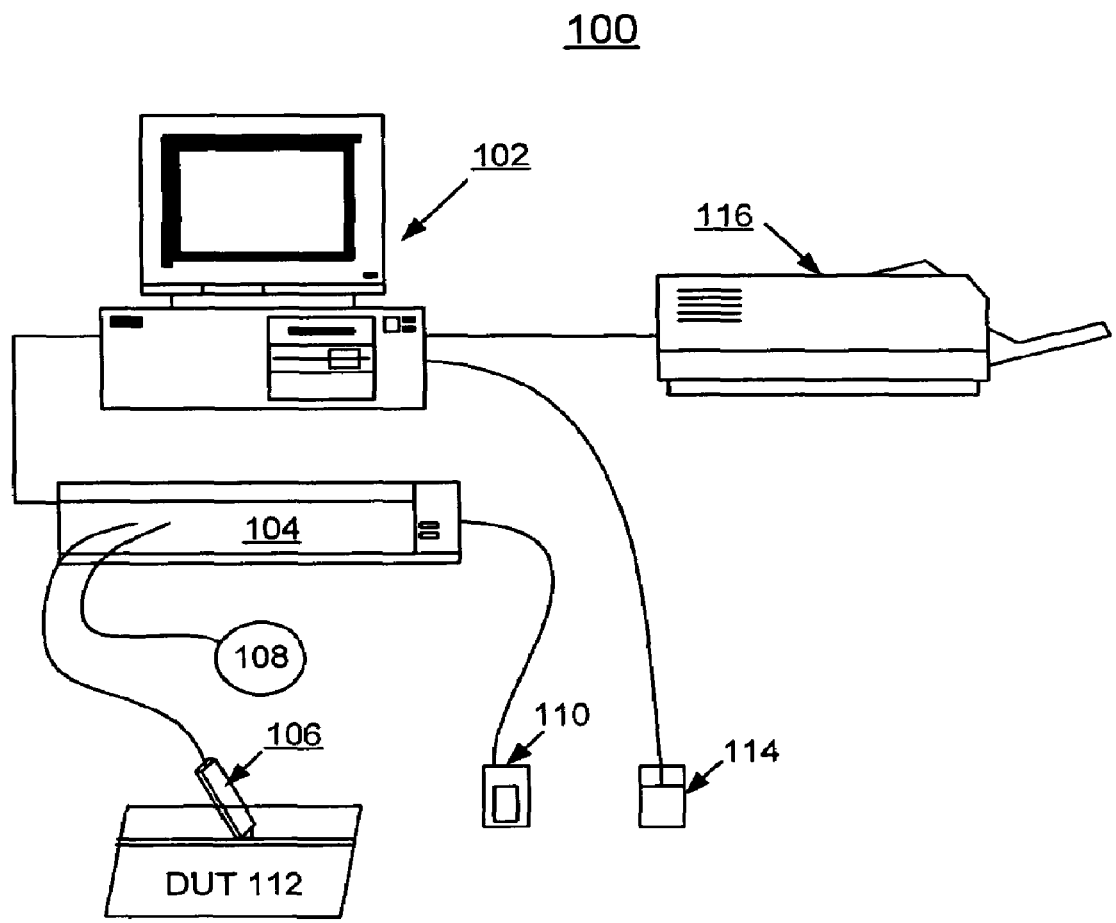
FIG. 1 is a block diagram representation illustrating an exemplary computer test system for implementing automatic-calibration of a Time Domain Reflectometer (TDR) probing apparatus in accordance with the preferred embodiment.
Figure 2:
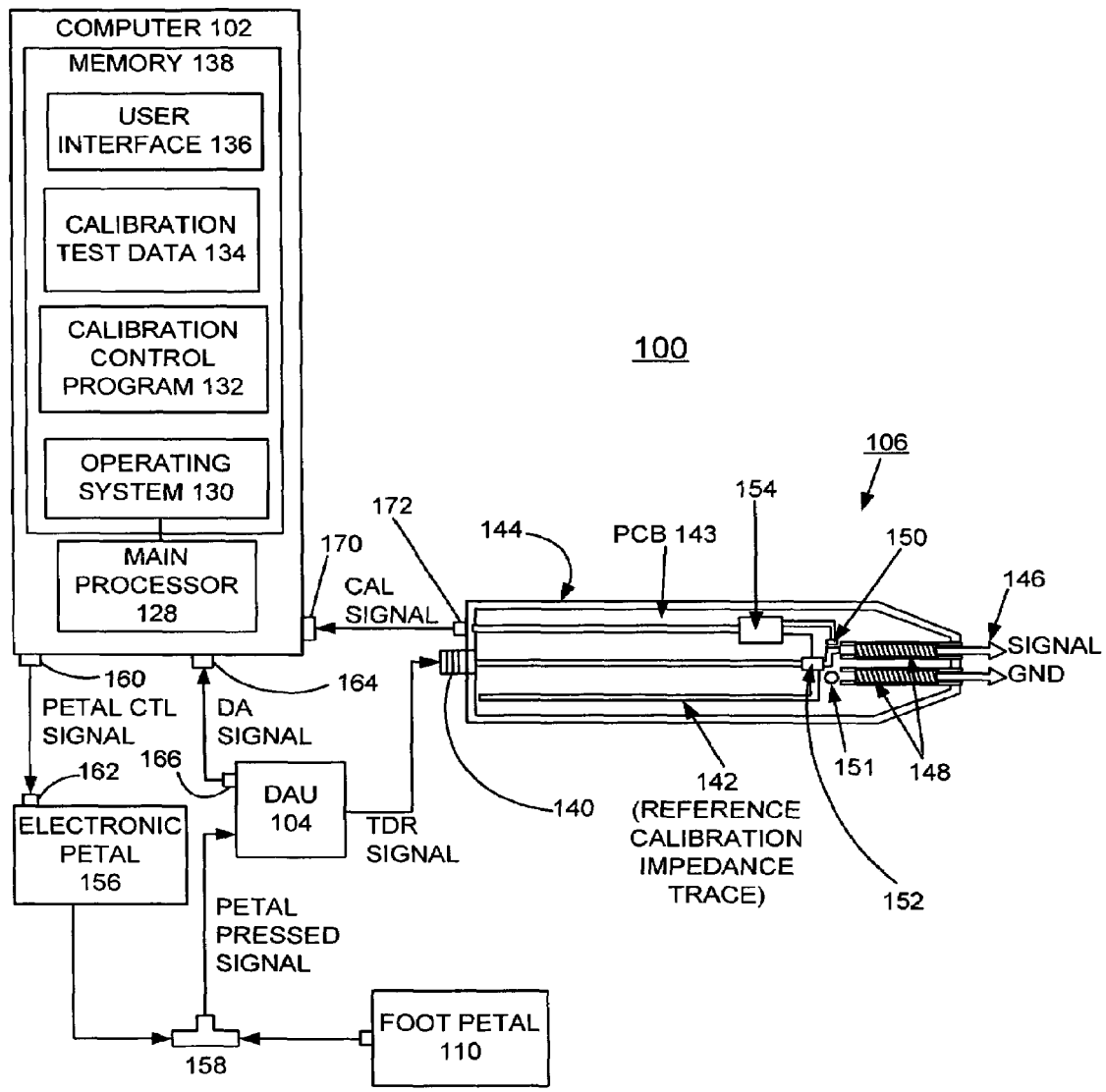
FIG. 2 is a more detailed schematic and block diagram representation illustrating exemplary apparatus of the computer test system of FIG. 1 for implementing automatic-calibration of a Time Domain Reflectometer (TDR) probing apparatus in accordance with the preferred embodiment.

Referring now to the drawings, in FIGS. 1 and 2 there is shown a computer test system generally designated by the reference character 100 for carrying out methods for implementing automatic-calibration of a Time Domain Reflectometer (TDR) probing apparatus in accordance with the preferred embodiment. Computer test system 100 includes a computer 102 coupled to a data acquisition unit (DAU) 104. A Time Domain Reflectometer (TDR) probe 106 in accordance with the preferred embodiment, a wrist strap 108 worn by a user of test system 100, and a foot petal 110 are coupled to the DAU 104. A normal measurement process is initiated via the small foot-pedal 110 actuated by the operator.

In accordance with features of the invention, user intervention is not required in order to perform a calibration procedure. Rather, a calibration procedure is handled automatically each time the user lifts the TDR probe 106 from a device under test (DUT) 112. A normal or conventional calibration technique, such as a calibration procedure using airlines or other known impedance comparisons, is handled automatically to ensure that the recorded test data is accurate.

Computer test system 100 includes a mouse 114 and a printer 116 coupled to the computer 102. Data acquisition unit (DAU) 104 can be implemented, for example with CITS800 TDR test system manufactured and sold by Polar Instruments Inc., San Mateo, Calif. The TDR probe 106 can be implemented with an upgraded and enhanced version of a TDR probe manufactured and sold by Polar Instruments Inc. TDR probe 106 of the preferred embodiment is illustrated and further described in more detail with respect to FIG. 2.

While many printed circuit vendors utilize test equipment manufactured by Polar Instruments Inc., and the automatic-calibration methods of the present invention improves the reliability of impedance data captured using Polar TDR equipment; it should be understood that the present invention can be applied to various other hand held TDR probes and TDR probing systems.

As shown in FIG. 2, computer system 100 includes a main processor 128 or central processor unit (CPU) 128 and an operating system 130, a calibration control program 132 of the preferred embodiment, calibration test data 134, and a user interface 136 resident in a memory 138.

Various commercially available computers can be used for computer system 100, for example, with computer 102 implemented by an IBM personal computer. CPU 128 is suitably programmed by the calibration control program 132 for implementing automatic-calibration of a Time Domain Reflectometer (TDR) probing apparatus in accordance with the preferred embodiment.

Computer system 100 is shown in simplified form sufficient for understanding the present invention. The illustrated computer system 100 is not intended to imply architectural or functional limitations. The present invention can be used with various hardware implementations and systems and various other internal hardware devices.

FIG. 2 illustrates the TDR probe 106 receiving a TDR signal from the DAU 104, for example, via a SubMiniature version A (SMA) connector 140. TDR probe 106 includes a reference calibration impedance trace 142 carried by a printed circuit board (PCB) 143 enclosed within a cosmetic plastic case or housing 144 with a signal and ground pair probe tip generally designated by 146. Signal and ground pair probe tip 146 includes a pair of spring-load members 148 providing spring-loaded DUT contact points. TDR probe 106 includes a known calibration standard that is customizable per customer requirements and provided by the PCB trace 142 that is used to calibrate the system.

While the known calibration standard is shown as a tightly controlled PCB reference calibration impedance trace 142 having a specific characteristic impedance, it should be understood that the known calibration standard could also be implemented by, for example, an air line, in accordance with the invention.

TDR probe 106 optionally includes an optical sensor 150, a light emitting diode (LED) 151, and a single-pole double-throw (SPDT) relay 152 that are used in conjunction with control logic circuit 154 to switch the probe connection between a normal measurement trace path including the probe tips 146 and a known-impedance calibration path including the reference calibration impedance trace 142. An electronic petal 156 is coupled between computer 102 and a signal combining function 158 that is also coupled to the manually operated foot petal 110. A USB port 160 of computer 102 and a USB port 162 of the electronic petal 156 are used to couple a petal control signal applied by computer 102 to the electronic petal 156 indicated at a line labeled PETAL CTL SIGNAL. A petal pressed signal indicated at a line labeled PETAL PRESSED SIGNAL is applied by the signal combining function 158 to the DAU 104 that provides the TDR signal to TDR probe 106. A data acquisition signal indicated at a line labeled DA SIGNAL is applied by the DAU 104 to computer 102 via a respective serial port 164 of computer 102 and a serial port 166 of the DAU 104. A calibration signal indicated at a line labeled CAL SIGNAL is applied by the TDR probe 106 to computer 102 via a respective USB port 170 of computer 102 and a USB port 172 of the TDR probe 106.

Figure 3:
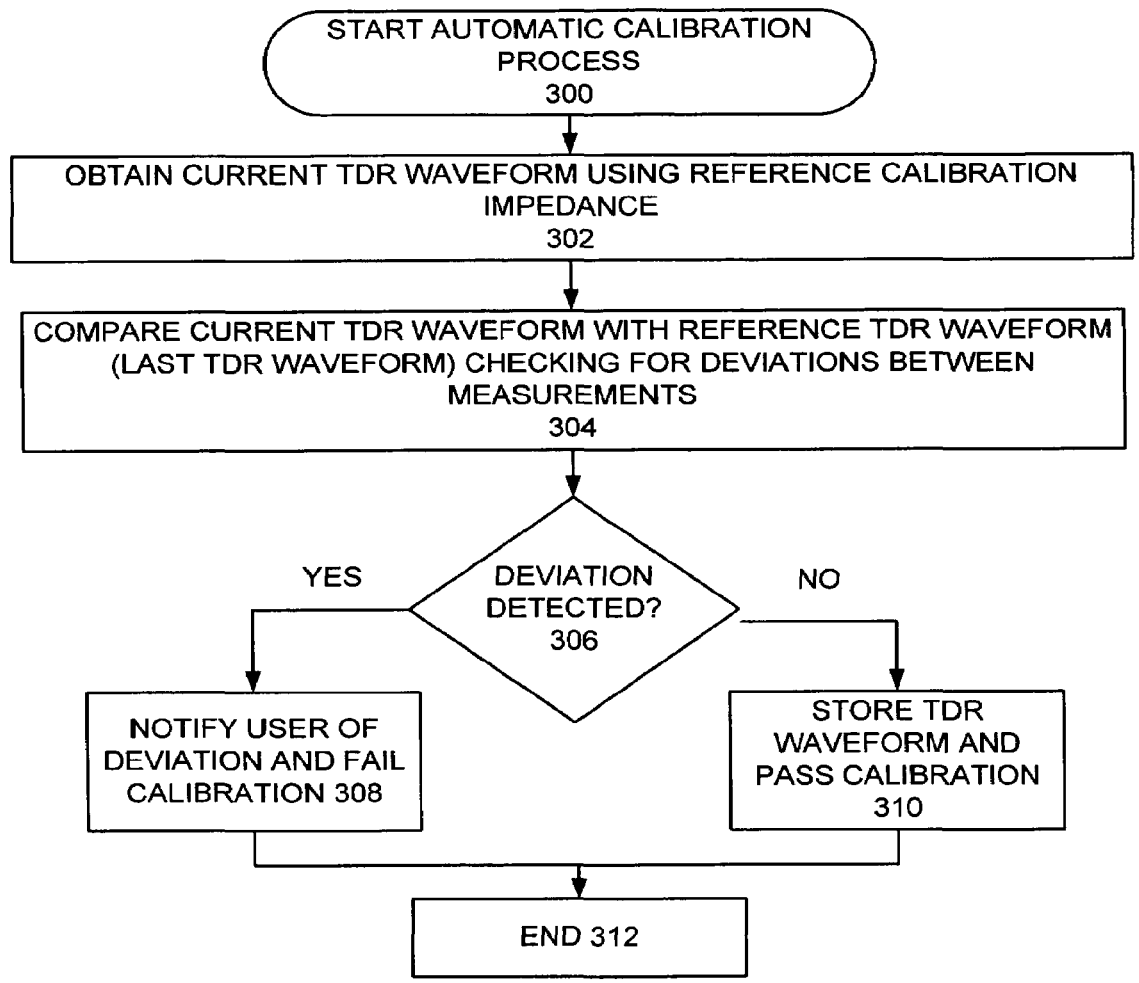
FIG. 3 is a flow chart illustrating exemplary steps of methods for implementing automatic-calibration in accordance with the preferred embodiment.

Referring now to FIG. 3, there are shown exemplary steps of methods for implementing automatic calibration in accordance with the preferred embodiment starting at a block 300. A current calibration TDR waveform is obtained as indicated in a block 302. A stored reference calibration TDR waveform, such as an immediately previous calibration TDR waveform is compared with the current calibration TDR waveform checking for deviations between the measurements as indicated in a block 304.

In accordance with features of the invention, computer 102 implements the automatic calibration method to confirm that a current calibration TDR waveform compares with the previous calibration TDR waveform, both using the known impedance standard 142 and specifically looks for deviations between measurements. If a deviation is detected as indicated in a decision block 306, then the user is notified and calibration is failed as indicated in a block 308. The user then can subsequently perform a complete diagnostic and calibration procedure per the manufacturers guidelines. Otherwise, if a deviation is not detected as indicated in a decision block 306, then the current calibration TDR waveform is stored as indicated in a block 310. The automatic calibration process ends as indicated in a block 312.

The calibration method of the invention ensures that the impedance measurement test system 100 maintains expected impedance and launch values from one measurement cycle/DUT to the next. This calibration process is repeated automatically, between user measurements, without requiring user intervention.

Computer 102 controlling the calibration process receives a calibration signal that indicates when the operator has lifted the probe 106 off of the DUT 112 to initiate the auto-calibration procedure. A preferred implementation to provide the calibration signal is to use a probe-mounted sensor, such as defined by optical sensor 150 and LED 151, to detect when the spring-loaded pins 148 are fully extended when removed from the DUT 112. The spring-loaded pins 148 are retracted when the probe tip 146 is pressed onto the DUT 112.

Simple control logic 154 on the PCB 143 inside the probe housing 144 communicates to the computer 102 controlling the TDR test system 100 via the USB or other standard port connections 170, 172. Test system 100 then initiates the auto-calibration procedure using probe-mounted control logic and the impedance controlled relay 152 to redirect the TDR signal from the DUT, to the internal calibration standard 142. Once calibration has completed, for example, typically less than 1-2 seconds, the relay 152 resumes continuity of the transmission line to the DUT 112.

Figure 4A:
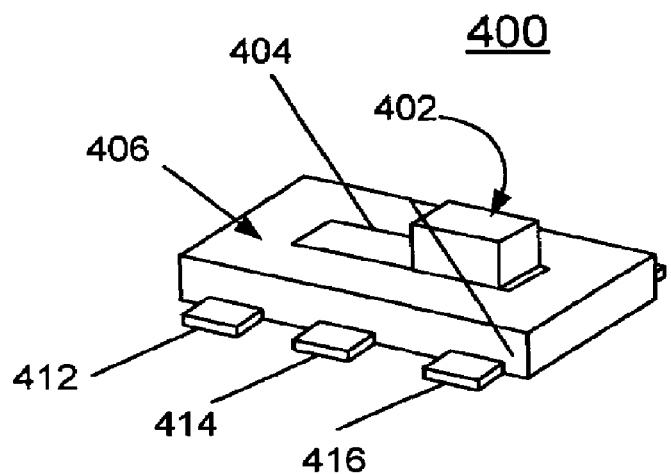
FIGS. 4A, and 4B are a perspective view and a top view including interior details illustrating an exemplary two-way switch for use in the computer test system of FIG. 1 for implementing automatic-calibration of a Time Domain Reflectometer (TDR) probing apparatus in accordance with the preferred embodiment.
Figure 4B:
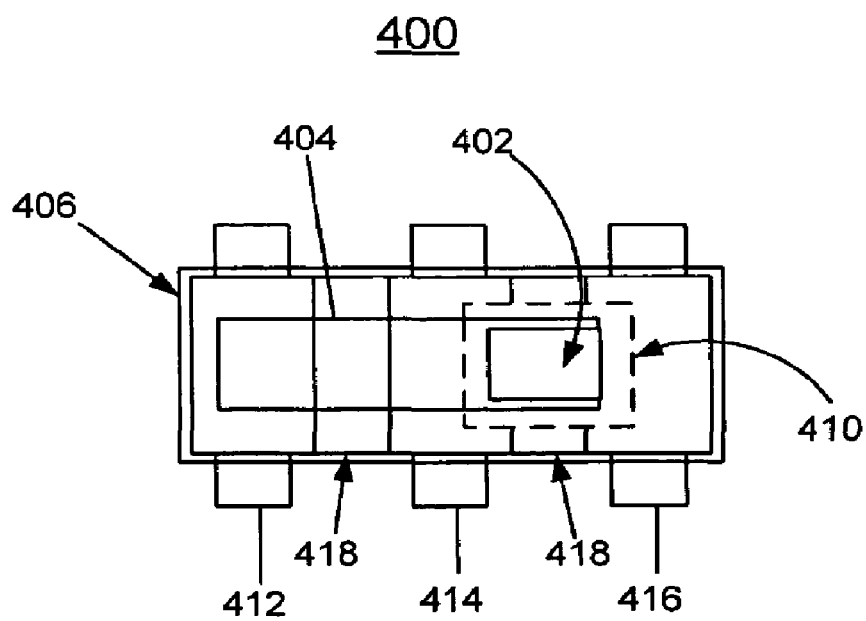

Referring to FIGS. 4A, and 4B, there is shown an exemplary mechanical control switch generally designated by the reference character 400. Mechanical control switch 400 is implemented with the spring loaded probe tips such that the switch between normal and calibration measurement paths is made when the probe tip 146 is lifted from the DUT 112.

Mechanical control switch 400 includes an actuator member 402 positioned for sliding movement within a slot 404 of a switch housing 406. Actuator member 402 is positioned within the TDR probe 106 for cooperative engagement with the pair of spring-load members 148 for providing controlled switch movement.

As shown in FIG. 4B, the actuator member 402 includes an electrically conductive member 410 illustrated in dotted line for providing controlled switch movement between respective pairs of a plurality of electrical contacts 412, 414, 416. A respective electrically insulative material 418 is provided between the electrical contacts 412 and 414 and electrical contacts 414 and 416. The actuator member portion 410 is moved corresponding to movement of the spring-load members 148 to switch the probe connection between the normal measurement trace path including the probe tips 146 and the known-impedance calibration path including the reference calibration impedance trace 142.

Figure 5:
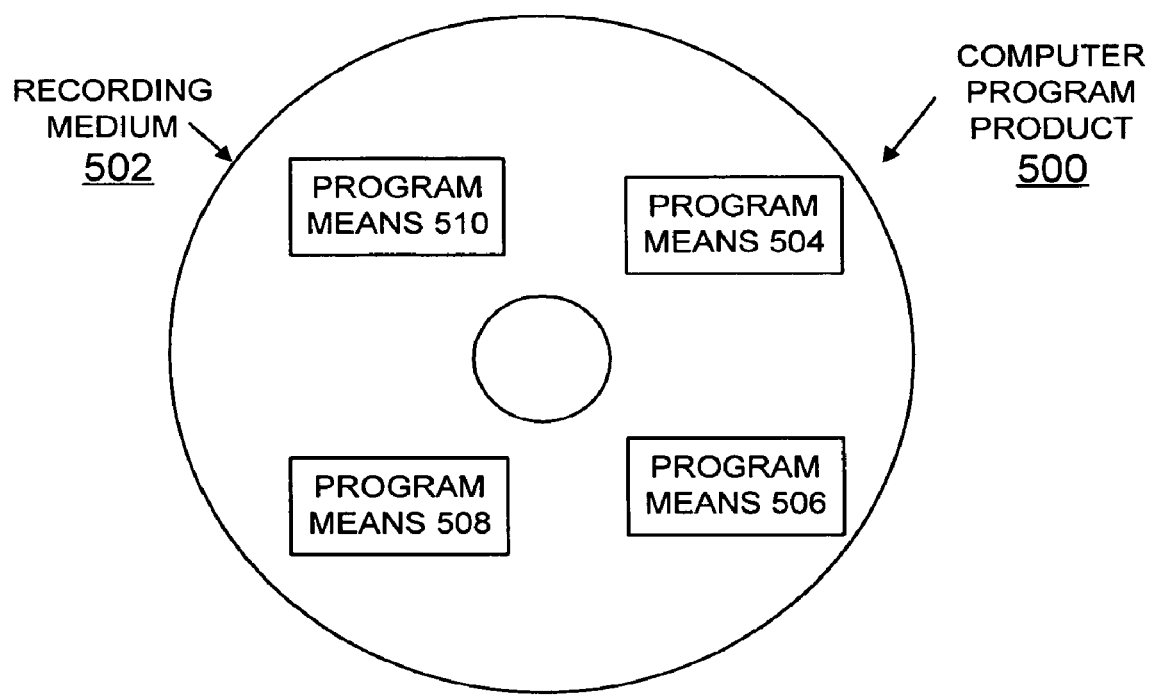
FIG. 5 is a block diagram illustrating a computer program product in accordance with the preferred embodiment.

Referring now to FIG. 5, an article of manufacture or a computer program product 500 of the invention is illustrated. The computer program product 500 includes a recording medium 502, such as, a floppy disk, a high capacity read only memory in the form of an optically read compact disk or CD-ROM, a tape, a transmission type media such as a digital or analog communications link, or a similar computer program product. Recording medium 502 stores program means 504, 506, 508, 510 on the medium 502 for carrying out the methods for implementing automatic-calibration in accordance with the preferred embodiment in the system 100 of FIG. 1.

A sequence of program instructions or a logical assembly of one or more interrelated modules defined by the recorded program means 504, 506, 508, 510, direct the computer test system 100 for implementing automatic-calibration of the preferred embodiment.

While the present invention has been described with reference to the details of the embodiments of the invention shown in the drawing, these details are not intended to limit the scope of the invention as claimed in the appended claims.

What is claimed is:

1. A computer-readable medium encoded with a computer program product for implementing automatic-calibration of a Time Domain Reflectometer (TDR) probing computer test system, said computer-readable medium consisting one of a floppy disk, a high capacity read only memory in the form of an optically read compact disk or CD-ROM, and a tape, said computer program product including instructions stored on said computer-readable medium and wherein said instructions, when executed by a computer, cause the computer to perform the steps of:

performing a calibration procedure automatically each time a TDR probe is moved from a device under test (DUT);

obtaining and comparing a current calibration TDR waveform with a reference calibration TDR waveform including switching from a normal measurement path including a TDR probe tip to a calibration reference path including a reference calibration impedance trace;

providing an optical sensor for detecting the TDR probe being moved from the device under test (DUT); and a relay for switching between said normal measurement path and said calibration reference path;

checking for deviations between the current calibration TDR waveform and the reference calibration TDR waveform; and responsive to detecting a deviation, notifying a user of a failed calibration.

2. A computer-readable medium encoded with a computer program product for implementing automatic-calibration as recited in claim 1 wherein obtaining and comparing said current calibration TDR waveform with said reference calibration TDR waveform includes using a reference calibration impedance provided with the TDR probe for obtaining said current calibration TDR waveform.

3. A computer-readable medium encoded with a computer program product for implementing automatic-calibration as recited in claim 2 includes using said reference calibration impedance provided with the TDR probe for obtaining said reference calibration TDR waveform.

4. A computer-readable medium encoded with a computer program product for implementing automatic-calibration as recited in claim 1 includes responsive to detecting no deviations, storing said current calibration TDR waveform.

* * * * *